United States Patent [19]

AuCoin et al.

[11] 4,247,358

[45] Jan. 27, 1981

[54] METHOD OF GROWING SINGLE CRYSTALS OF ALPHA ALUMINUM PHOSPHATE

[75] Inventors: Thomas R. AuCoin, Ocean; Abraham Schwartz, Oakhurst; Melvin J. Wade, Tinton Falls; Roger J. Malik, Eatontown, all of N.J.

[73] Assignee: The United States of America as represented by the Secretary of the Army, Washington, D.C.

[21] Appl. No.: 46,961

[22] Filed: Jun. 8, 1979

[51] Int. Cl.³ .............................................. C30B 7/10
[52] U.S. Cl. .............................. 156/601; 156/623 R; 156/DIG. 61
[58] Field of Search ................... 156/623 R, DIG. 61, 156/601, DIG. 73; 432/311; 423/305, 626

[56] References Cited

U.S. PATENT DOCUMENTS

| | | | |
|---|---|---|---|
| 2,647,043 | 7/1953 | Ihiber | 156/623 R |
| 2,793,941 | 5/1957 | Estes | 156/623 R |

FOREIGN PATENT DOCUMENTS 1280887  1/1962  France .............................. 156/DIG. 61

*Primary Examiner*—Hiram Bernstein
*Attorney, Agent, or Firm*—Nathan Edelberg; Sheldon Kanars; Roy E. Gordon

[57] ABSTRACT

Single crystals of alpha aluminum phosphate of high crystal perfection are grown from seeded solutions of aluminum orthophosphate and orthophosphoric acid in such a manner as to provide direct visual observation of the crystal growth process and allow precise determination of nucleation and growth kinetics.

The method involves sealing the seeded solution in clear quartz ampules, inserting the ampules into a precisely temperature controlled silicone oil bath, increasing the temperature of the silicone oil bath from ambient temperature to approximately 150 degrees C. over a three hour period, programming the temperature of the bath upward at the rate of 0.1 to 2.0 degrees C. per day for periods up to sixty days, and removing the quartz ampules from the silicone oil bath and quickly cooling and removing the crystals.

11 Claims, No Drawings

METHOD OF GROWING SINGLE CRYSTALS OF ALPHA ALUMINUM PHOSPHATE

The invention described herein may be manufactured, used, and licensed by or for the Government for governmental purposes without the payment to us of any royalty thereon.

This invention relates in general to a method of growing single crystals and in particular, to a method of growing single crystals of Berlinite ($\alpha$-AlPO$_4$).

BACKGROUND OF THE INVENTION

Berlinite has the potential for replacing $\alpha$-quartz in bulk and surface acoustic wave applications because it combines low loss with higher piezoelectric coupling factors; about two and one-half and four times for bulk and surface waves, respectively. It also has a locus of zero temperature coefficient cuts. Because of these properties, Berlinite can be used in crystal oscillators and filters, and in devices involving long delay lines for electronic warfare, surveillance and target acquisition, pulse compression, and signal correlation.

Heretofore, Berlinite has been prepared by addition of aluminum orthophosphate to a seeded orthophosphoric acid contained in a platinum or silver ampule. The ampule is sealed and placed in a Morey-type of Tem-Pres type high pressure autoclave. The temperature of this hydrothermal growth setup is raised slowly over a period of several weeks. The autoclave is then cooled and the ampule is removed from the autoclave, opened and the crystal is removed from the orthophosphoric acid. The crystals of Berlinite grown by this technique generally have imperfections such as veiling, channeling, cracking, and surface damage.

SUMMARY OF THE INVENTION

The general object of this invention is to provide a method of growing single crystals of Berlinite. A further object is to provide such a method wherein the single crystals grown will be of large size, high purity and exceptional quality. A still further object of the invention is to provide such a method wherein the resulting crystals can be used as temperature compensated piezoelectric material in applications such as resonators for oscillators and filters, delay lines and frequency filters for correlation, pulse compression, and matched filtering.

The foregoing objects now have been attained by growing single crystals of alpha aluminum phosphate from seeded solutions of aluminum orthophosphate and orthophosphoric acid in such a manner as to provide direct visual observation of the crystal growth process and allow precise determination of nucleation and growth kinetics. More particularly, single crystals of alpha aluminum phosphate are grown according to the invention by sealing seeded solutions of aluminum orthophosphate and orthophosphoric acid in clear quartz ampules, inserting the ampules into a precisely temperature controlled silicone oil bath, increasing the temperature of the silicone oil bath from ambient temperature to approximately 150 degrees C. over a three hour period, programming the temperature of the bath upward at the rate of 0.1 to 2.0 degrees C. per day for about thirty days, removing the quartz ampule from the silicone oil bath, and then quickly cooling to prevent dissolution of the crystal because of the retrograde solubility of alpha aluminum phosphate.

DESCRIPTION OF THE PREFERRED EMBODIMENT

Two hundred grams of aluminum orthophosphate is dissolved in one liter of 6 molar refluxing orthophosphoric acid at a temperature of 100 degrees centigrade. Since aluminum orthophosphate in orthophosphoric acid exhibits a negative temperature coefficient of solubility, a low temperature solution dissolves a greater quantity of aluminum orthophosphate than a high temperature solution. The solution is then poured into clear quartz ampules approximately eight inches tall, having a one inch diameter and wall thickness of three millimeters. Eighty percent of the ampules are filled with the solution. The solution covers a Berlinite seed crystal resting on a quartz support plate, which in turn is fused to the ampule at its center. The ampules are then hermetically sealed and immersed in a silicone oil bath contained in a pyrex jar. The bath is heated by a precision temperature programable circulator and a hot plate with a magnetic stirrer. This provides for thorough mixing of the silicone oil and the ability to vary the vertical temperature gradient. The temperature of the silicone oil and the ampule is precisely regulated ($\pm 0.005$ degree C.) by the circulator. For personnel protection, the entire equipment setup is surrounded by a clear polycarbonate shield. The entire apparatus provides one with direct visual observation of the growing Berlinite crystals, and a large stable thermal mass, the temperature of which is precisely controlled. Over a three hour period, the temperature of the silicone oil bath is increased from ambient temperature to approximately 150 degrees C. Then the temperature of the bath is programmed upward at the rate of 0.5 degree C. per day for thirty days. The growth rate of the Berlinite in the z-direction is typically 0.50 mm/day. At the end of the run, the quartz ampule is removed from the silicone oil bath and quickly cooled and the crystals removed so as to prevent dissolution because of the retrograde solubility of $\alpha$-AlPO$_4$ in phosphoric acid. The Berlinite crystals grown by this invention are of high quality and clarity.

EXAMPLE 2

This method is the same as in the preferred embodiment except that small crystals of Berlinite are added to the ampule containing the Berlinite seed and the AlPO$_4$/H$_3$PO$_4$ solution. The temperature of that part of the ampule containing the small crystals of Berlinite are at a lower temperature than that part of the ampule in which the seed rests. During the course of the experiment, the small crystals dissolve, are transported, and reprecipated onto the Berlinite seed. This causes an increase in the size of the Berlinite crystal resting on the support plate.

EXAMPLE 3

This method is the same as in the preferred embodiment except that the Berlinite seed crystal is cleaned by a solution of ammonium bifluoride and by exposure to a gaseous plasma prior to insertion into the ampule containing the AlPO$_4$/H$_3$PO$_4$ solution. This cleaning procedure results in veil-free overgrowth.

EXAMPLE 4

This method is the same as in the preferred embodiment except that a teflon coated magnetic stirrer is sealed in the growth ampule for better stirring during crystal growth of the Berlinite.

EXAMPLE 5

This method is the same as in the preferred embodiment except that the aluminum orthophosphate nutrient is replaced by aluminum hydroxide in the orthophosphoric acid solvent.

EXAMPLE 6

This method is the same as in the preferred embodiment except that sodium aluminate is used as the nutrient in the orthophosphoric acid.

EXAMPLE 7

This method is the same as in the preferred embodiment except that a seed of α-quartz is used rather than a seed of α-aluminum phosphate (Berlinite).

EXAMPLE 8

This method is the same as in the preferred embodiment except that a gold or platinum wire is used to suspend the Berlinite seed crystal in the growth solution.

EXAMPLE 9

This method is the same as in the preferred embodiment except that the ampule is made of clear sapphire.

The method of the invention can be applied to the growing of other single crystals such as boron phosphate and aluminum arsenate.

We wish it to be understood that we do not desire to be limited to the exact details of construction as described for obvious modifications will occur to a person skilled in the art.

What is claimed is:

1. Method of growing single crystals of alpha aluminum phosphate of high crystal perfection from seeded solutions of aluminum orthophosphate and orthophosphoric acid in such a manner as to provide direct visual observation of the crystal growth process and allow precise determination of nucleation and growth kinetics, said method including the steps of:
    (A) sealing the seeded solution in clear quartz ampules,
    (B) inserting the ampules into a precisely temperature controlled silicone oil bath,
    (C) increasing the temperature of the silicone oil bath from ambient temperature to approximately 150 degrees C. over a three hour period,
    (D) programming the temperature of the bath upward at the rate of 0.1 to 2.0 degrees C. per day for about thirty days, and
    (E) removing the quartz ampules from the silicone oil bath and quickly cooling and removing the crystals.

2. Method according to claim 1 wherein small crystals of alpha aluminum phosphate are added to the seeded solution in the quartz ampule prior to sealing.

3. Method according to claim 1 wherein the Berlinite seed crystal is cleaned by a solution of ammonium bifluoride and by exposure to a gaseous plasma prior to insertion into the ampule containing the $AlPO_4/H_3PO_4$.

4. Method according to claim 1 wherein a teflon coated magnetic stirrer is sealed in the growth ampule for better stirring during crystal growth of the alpha aluminum phosphate.

5. Method according to claim 1 wherein the aluminum orthophosphate is replaced by aluminum hydroxide in the orthophosphoric acid solvent.

6. Method according to claim 1 wherein the aluminum orthosphosphate is replaced by sodium aluminate in the orthophosphoric acid solvent.

7. Method according to claim 1 wherein a seed of α-quartz is used instead of α-aluminum phosphate.

8. Method according to claim 1 wherein a gold wire is used to suspend the alpha aluminum phosphate seed crystal in the growth solution.

9. Method according to claim 1 wherein a platinum wire is used to suspend the Berlinite seed crystal in the growth solution.

10. Method according to claim 1 wherein the ampule is made of sapphire.

11. Method of growing single crystals of alpha aluminum phosphate of high crystal perfection in such a manner as to provide direct visual observation of the crystal growth process and allow precise determination of nucleation and growth kinetics, said method consisting of:
    (A) dissolving 200 grams of aluminum orthophosphate in one liter of 6 molar refluxing orthophosphoric acid at about 100 degrees C.;
    (B) pouring the solution into clear quartz ampules about 8 inches tall, having a 1 inch diameter and wall thickness of 3 millimeters and containing an alpha aluminum phosphate seed crystal resting on a support plate which in turn is fused to the ampule at its center;
    (C) hermetically sealing the ampules;
    (D) immersing the ampules into a silicone oil bath contained in a pyrex jar;
    (E) programming the temperature of the bath upward at the rate of 0.5 degree C. per day for thirty days; and
    (F) removing the quartz ampule from the silicone oil bath and quickly cooling and removing the crystals.

* * * * *